United States Patent [19]
Gilberg et al.

[11] 3,953,838
[45] Apr. 27, 1976

[54] FIFO BUFFER REGISTER MEMORY UTILIZING A ONE-SHOT DATA TRANSFER SYSTEM

[75] Inventors: Robert Charles Gilberg, Escondido; Frank Chung-Yai Young, Santa Clara, both of Calif.

[73] Assignee: Burroughs Corporation, Detroit, Mich.

[22] Filed: Dec. 30, 1974

[21] Appl. No.: 537,680

[52] U.S. Cl. .......................... 340/173 R; 307/221 C
[51] Int. Cl.² ................. G11C 19/00; G11C 11/24; H03K 25/02
[58] Field of Search ............................. 328/37, 42; 307/221 R–221 C; 340/173 R

[56] References Cited
UNITED STATES PATENTS

| | | | |
|---|---|---|---|
| 3,646,526 | 2/1972 | Fagen et al. | 307/221 C |
| 3,763,480 | 10/1973 | Weimer | 307/221 C |
| 3,824,562 | 7/1974 | Liebowitz et al. | 307/221 R |

Primary Examiner—Vincent P. Canney
Attorney, Agent, or Firm—Manuel Quiogue; Leonard C. Brenner; William B. Penn

[57] ABSTRACT

A FIFO (first-in-first-out) buffer register in which memory data words flow in parallel from an input register through a plurality of registers towards an output register under the automatic control of a one-shot (monostable multivibrator) data transfer system. A one-shot device and a status flip-flop are associated with each individual register in the plurality of registers to asynchronously transfer a data word register-by-register from the input register to the register nearest the output register that is not occupied by a previously inputted data word. The automatic data word transfer system is initiated by either reading a word into the input register or reading a word out of the output register. Logic controls for handling the reading-in and reading-out functions operate asynchronously and independently.

13 Claims, 4 Drawing Figures

FIFO BUFFER REGISTER MEMORY UTILIZING A ONE-SHOT DATA TRANSFER SYSTEM

BACKGROUND OF THE INVENTION

This invention relates to data word transfer system for use in a FIFO (first-in-first-out) buffer memory and more particularly to a MOS technology compatible data word transfer system for use in a FIFO buffer memory having utility for interfacing high speed processors with low speed I/O devices.

Prior art FIFO buffer register memories generally transfer data words therethrough using the modified RAM method, the static shift with internal two-phase generator method, or the ripple through static shift register method. The modified RAM method requires rather complicated input and output address counters and decoders, comparators, and read/write control logic. The static shift with internal two-phase generator method is not practical for high speed (1mHz) MOS realization since clock frequency variations due to layout and process parameters may be as high as 40%. Also, synchronizers are required to synchronize external data and control signals with those generated in the memory. Finally, the ripple through method requires complicated stop-or-go decision logic to ripple data bits and control bits from the input to the output in a hand-shake operation.

It is therefore an object of the present invention to provide a simple reliable data word transfer system for use in a FIFO buffer memory.

It is another object of the present invention to provide a simple reliable FIFO buffer memory having an automatic asynchronous internal data transfer system with input and output controls that are both asynchronous and independent.

It is still another object of the present invention to provide a FIFO buffer memory particularly suitable for MOS integration.

SUMMARY OF THE INVENTION

The improved FIFO buffer register memory of the invention achieves the above and other objects and purposes of the invention by utilizing a one-shot data word transfer system wherein data words are automatically transferred register-by-register toward an output register under the control of one-shot and status flip-flop devices associated with each register. Pulses generated by the one shot-devices are used to shift data words through the memory in parallel format to the register nearest the output that is not occupied by a previously inputted data word. The buffer register memory input and output controls function asynchronously and independently. In the preferred embodiment, the FIFO buffer register memory is realized through MOS integrated circuit technology.

DESCRIPTION OF THE DRAWINGS

The above-mentioned and other objects, advantages and features of the present invention will become more readily apparent from a review of the followng specification when taken together with the drawings wherein:

FIG. 2b is the electrical schematic of the logic diagram of FIG. 2a; and

DETAILED DESCRIPTION OF THE INVENTION

Figure 1:
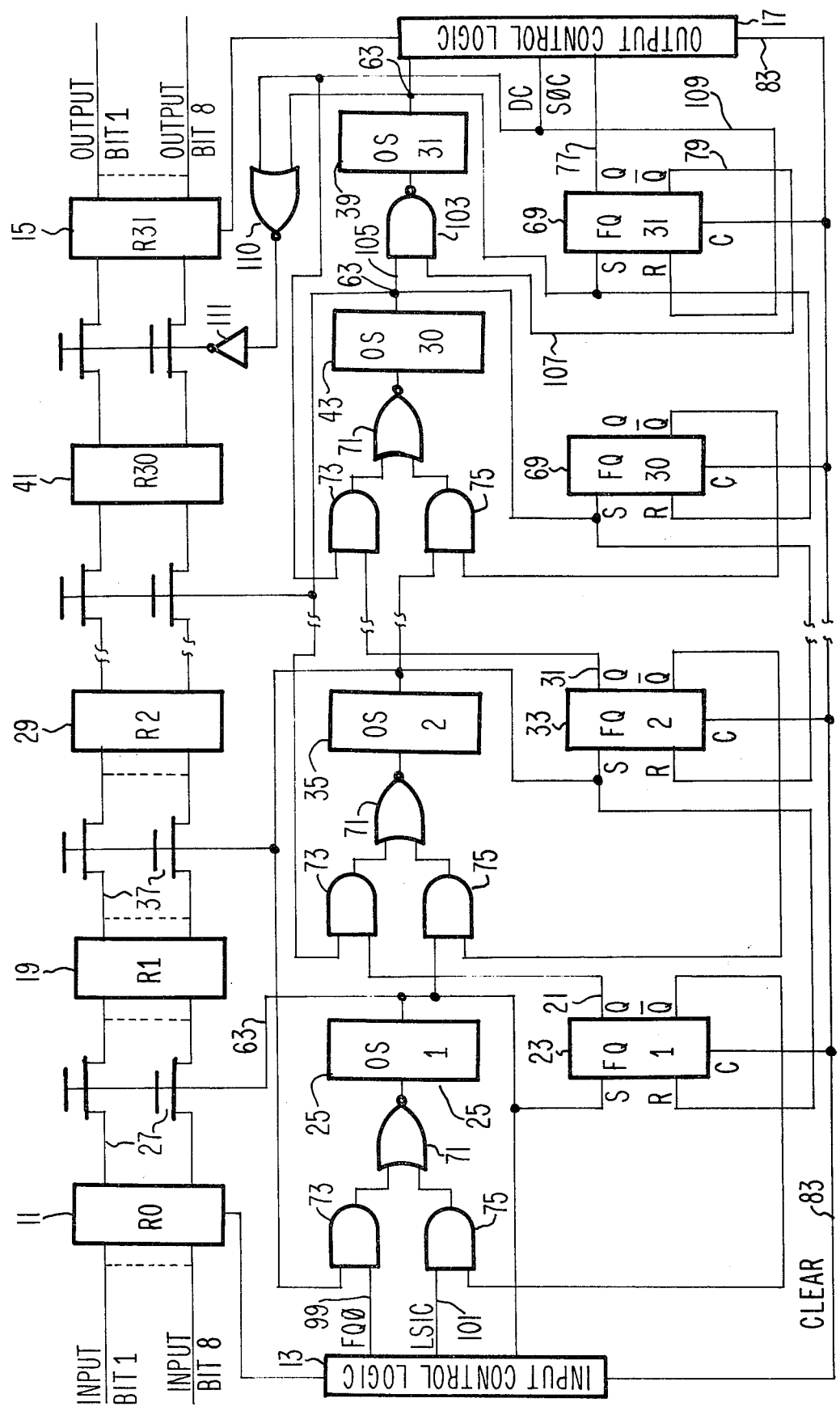
FIG. 1 is a block diagram of a FIFO buffer register memory using the data word transfer system of the present invention.

In the preferred embodiment of the invention, shown in FIG. 1, an array of registers with individually associated one-shot (monostable multivibrator) and status flip-flop devices interpose the input and output registers of a FIFO (first-in-first-out) buffer register memory. Data words entering the FIFO memory are automatically transferred register-by-register through the FIFO memory in parallel format. Preferably, the FIFO memory accepts and transfers data words of 8 bits through 32 registers counting the input and output registers but other word lengths and FIFO memories having other register lengths may also be used.

Data words enter the FIFO memory from an external data source such as a data processing peripheral device having its own particular clocking, synchronization, and control characteristics. An input register 11 for reading data words into the FIFO memory is selected according to particular data source characteristics from a variety of input registers well-known in the prior art. For example, the input register selected may be of the serial input type, the parallel input type, or preferably the type having capacity for both serial and parallel input. An input control logic circuit 13 provides the interface, control and synchronization signals required to guide the input register 11 in performing its reading-in function. Such input control circuits are well-known in the prior art.

Likewise, data words are read out of the FIFO memory to feed an external data sink or unit such as a central data processor having its own particular clocking, synchronization, and control characteristics. Therefore, in a manner similar to that employed at the FIFO memory input, an output register 15 and an associated output control logic circuit 17 are selected from the prior art to read data words out of the FIFO memory in either serial or parallel format according to particular data sink or unit characteristics.

A brief description of the data transfer operation of the present invention is presented below and will be followed by a more detailed description of logic and circuit particulars. In operation, after a data word has read into the input register 11 and the first succeeding register 19 is empty as indicated by a logical zero level on the Q output 21 of a first status flip-flop 23, a pulse is generated by a first one-shot 25 in a manner to be described hereinafter. The pulse from the first one-shot 25 turns on a set of transfer gates 27 interposing the input register 11 and the first register 19, thereby transferring the data word in the input register 11, to the first register 19. The pulse generated by the first one-shot 25 also sets the first status flip-flop 23 thereby causing the Q output 21 thereof to switch to a logical one level indicating that a data word is currently residing in the first register 19. When the second register 29 is empty as indicated by a logical zero level on the Q output 31 of a second status flip-flop 33, a pulse is generated by a second one-shot 35 to turn on a set of transfer gates 37 between the first register 19 and the second register 29, thereby transferring the data word in the first register 19 to the second register 29. Also, the pulse generated by the second one-shot 35 will reset the first status flip-flop 23 causing the Q output 21 thereof to return to a logical zero level indicating that the first register 19 is again empty. In addition, the pulse will set the second status flip-flop 33 causing the Q output 31 thereof to switch to a logical one level indicating that the second register 29 is currently occupied by a data word. Continuing in such a manner, data words are transferred automatically register-by-register to the register nearest the output register 15 that is not occupied by previously inputted data words.

After the data word arrives at output register 15, it can be read out therefrom by the output control logic 17. Following data read out, a one-shot 39 associated with output register 15 will generate a pulse in a manner to be described hereinafter, to transfer data from the register 41 nearest the output register 15 to the output register 15. Continuing in this manner data is automatically shifted all the way from the input register 11 to the output register 15 to be read out therefrom under the control of the output control logic 17.

It can be seen from the above that an inputted data word is automatically transferred register-by-register towards the output and that the reading out of a data word causes all other data words in the FIFO memory to advance one register towards the output register 15. Thus, asynchronous data transfer from register-to-register is initiated automatically by either the input control logic 13 or the output control logic 17.

Figure 2A:
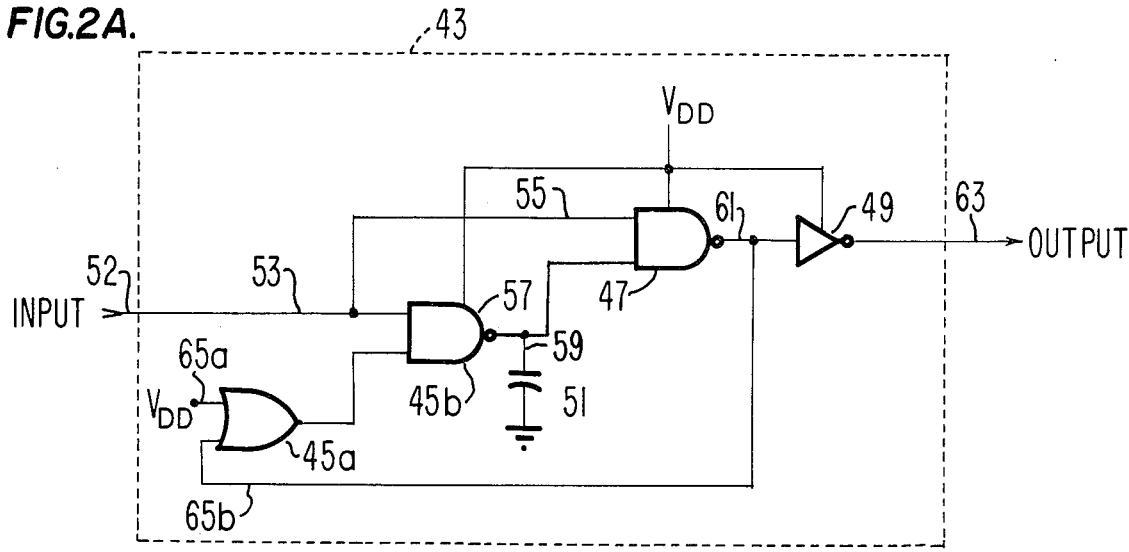
FIG. 2a is a logic diagram of a one-shot device used in the memory of FIG. 1.
Figure 2B:
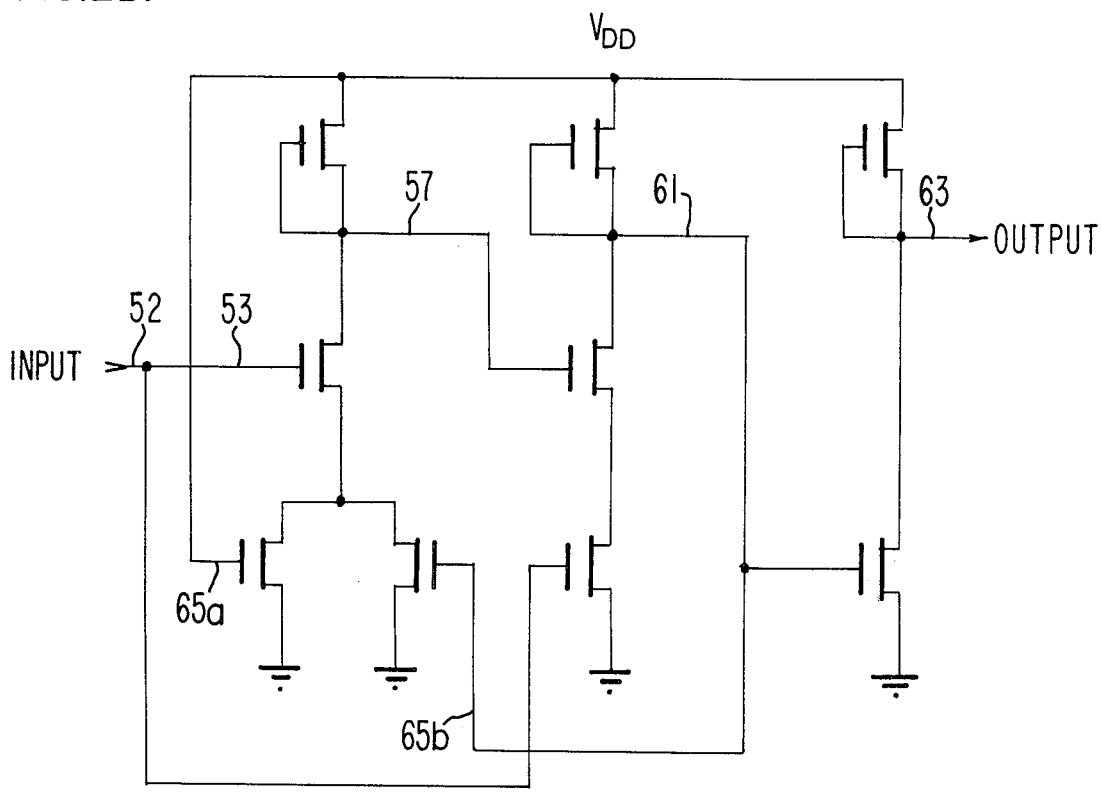

A more complete understanding of the transfer mechanism involved in the preferred embodiment of the invention may be derived from a consideration of a typical one-shot device 43, see FIGS. 2a and 2b. Although other one-shot configurations known in the prior art may be used, the one-shot device 43 in the preferred embodiment comprises a combinational logic gate which includes a two-input OR gate 45a and a two-input NAND gate 45b, a two-input NAND gate 47, an inverter 49, and a timing capacitor 51. One input, 65a, of the two-input OR gate 45a is biased at $V_{DD}$. This gate acts as a resistor and, together with the capacitor 51, forms an RC network to provide a desirable pulse width at the output of the one-shot. In the quiescent state, a logical one level input signal is present at the input 52 of the one-shot 43 which is also the first input 53 of NAND gate 45b and the first input 55 of the NAND gate 47. Since the input 65a of the OR gate 45a is at logic one level at all times, a logic one level at input 53 of NAND gate 45b assures that the NAND gate output 57 will be at logical zero, thereby presenting a logical zero level to the second input 59 of the NAND gate 47. Under the above-described conditions the output 61 of the NAND gate 47 is at a logical one level, which when fed through the inverter 49 provides a logical zero level signal at the one-shot output 63. The output 61 is fed back to the input 65b of OR gate 45a.

In operation, when a logical one level pulse is desired from the one-shot output 63 the input signal to the one-shot input 52 is pulsed from a logical one level to a logical zero level and back to a logical one level. During the logical zero pulse, the output 57 of the NAND gate 45b is switched to a logical one level, thereby charging the timing capacitor to a logical one level and presenting a logical one level signal at the second input 59 of the NAND gate 47. The NAND output 61 remains at a logical one level and the one-shot output 63 remains at a zero logical level. When the input signal returns to a logical one level, both the inputs 55 and 59 of the NAND gate 47 are at a logical one level, and the NAND gate output 61 is switched to a logical zero level which produces a logical one level at the output 63 of the one-shot 43. However, the second input 59 of the NAND gate 47 does not immediately see a logical zero level due to the energy storage effect of the timing capacitor 51. After the timing capacitor 51 has been discharged to a logical zero level, the NAND gate output 61 reverts to a logical one level and the one-shot output 63 returns to a logical zero level.

In summary, a logical one level is generally present at the input 52 of the one-shot 43 and a logical zero at the output 63. A logical zero pulse at the input 52 triggers the one-shot output 63 to a logical one pulse which begins at the time the input level returns to a logical one level and lasts in duration for a period depending upon the value of the timing capacitor 51 and the equivalent resistance of gate 65a in the two-input OR gate 45a.

Figure 3:
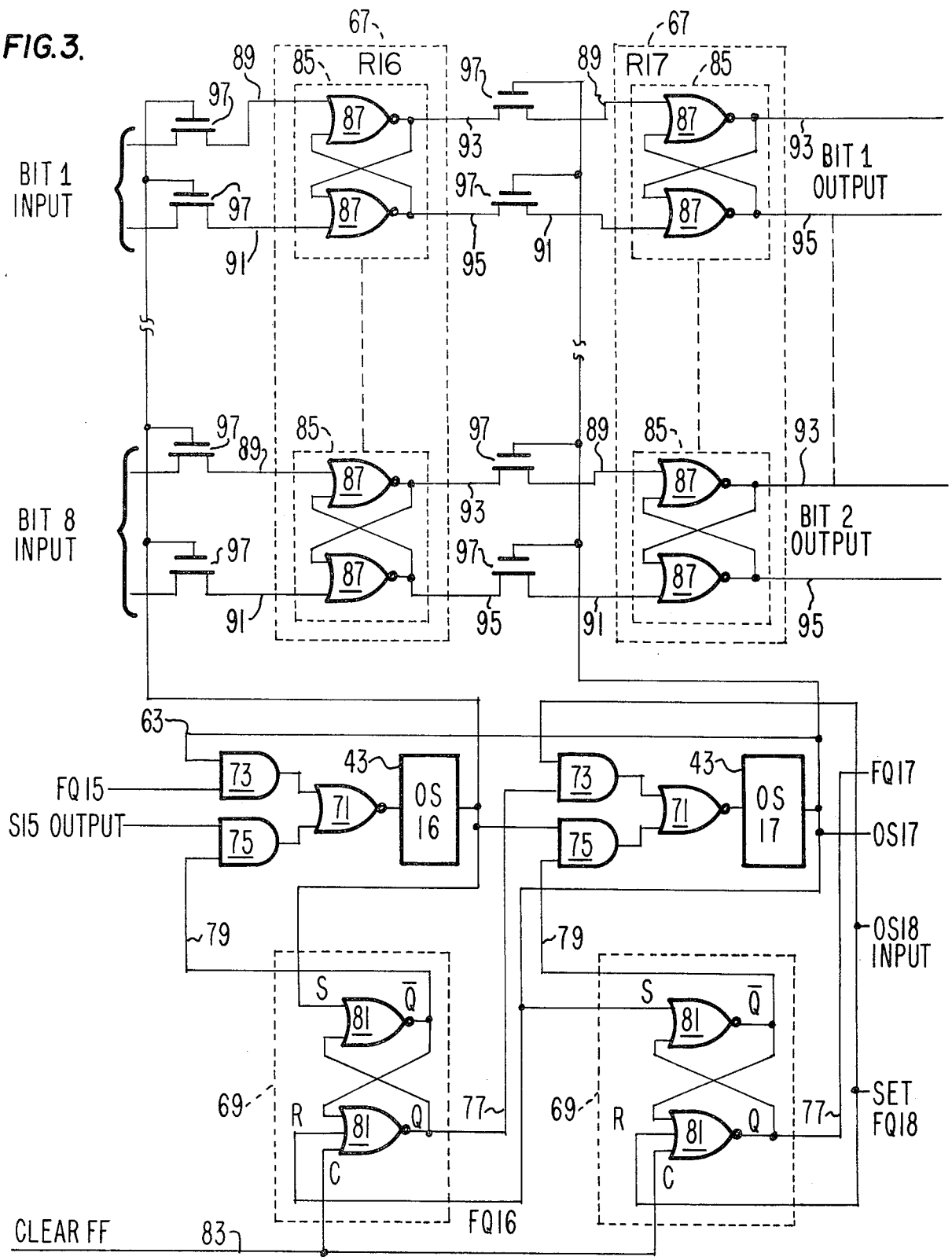
FIG. 3 is a logic diagram of two registers with associated one-shot and flip-flop devices for use in the memory of FIG. 1.

Referring now to FIG. 3, each one-shot 43 is combined with an associated register 67 and an associated status flip-flop 69. Each one-shot 43 is driven by a two-input NOR gate 71 which in turn is driven by a first two-input AND gate 73 and a second two-input AND gate 75.

The first AND gate 73 is fed by the Q output 77 of the preceding status flip-flop 69 and by the succeeding one-shot output 63. The second AND gate 75 is fed by the $\overline{Q}$ output 79 of the associated status flip-flop 69 and by the preceding one-shot output 63. Each status flip-flop 69 comprises a pair of cross-coupled NOR gates 81 and is set by its associated one-shot 43 and reset by the succeeding one-shot 43. A logical one level signal appears on the Q output 77 of a status flip-flop when it is set thereby indicating that its associated register 67 is occupied by a data word. Conversely, a logical one level signal on the $\overline{Q}$ output 79 indicates that the associated register 67 is currently vacant and ready to accept a new data word. A flip-flop clear line 83 is provided to simultaneously reset all status flip-flops. In the preferred embodiment a logical one level pulse is provided by the input control logic 13 to clear all status flip-flops. In alternate embodiments the clearing pulse may be provided by the output control logic 17, or it may be omitted altogether.

Each register 67 comprises a set of storage flip-flops 85, one flip-flop 85 for each bit of the data word to be stored. Each flip-flop 85 comprises a pair of cross-coupled NOR gates 87 and has two inputs 89 and 91, and two outputs 93 and 95 for receiving and transmitting data bits in a push-pull or noninverted-inverted fashion.

Interposing all register 67 are sets of MOS gates 97, an individual set between every two registers with each set including two MOS gates 97 for each bit of the data word to be stored and transferred. All the individual MOS gates 97 between each pair of registers 67 are energized simultaneously by a logical one pulse from an associated one-shot 43 to transfer a data word in parallel from register to register.

Referring now again to FIG. 1, a slight modification to the above-described data transfer mechanization is made near the input register 11 and the output register 15 to interface with the input control logic 13 and the output control logic 17.

Two adaptations are made for driving the first one-shot 25. First, the AND gate 73 associated with the first one-shot 25 is fed in part by a FQ$\phi$ signal 99 generated by the input control logic 13 instead of by the Q output 77 of the preceding status flip-flop 69 as is normally the rule. However, the FQφ signal 99 functions as a status flip-flop for the input register 11 by indicating the presence of a data word therein with a logical one level. If the input register 11 is of the parallel input type, the FQφ signal 99 is set to a logical one level as a data word enters the input register 11 whereas if the input register 11 is of the serial input type, the FQφ signal 99 is set to a logical one level after the last bit of a data word has been read in. After a data word has been transferred to the first register 19, the FQφ signal 99 is reset to a logical zero level. The output 63 of the first one-shot 25 is fed back to the input control logic 13 for resetting purposes. Methods for providing a logical level signal to indicate that a register is occupied by a data word are well-known in the prior art. Also, the status flip-flop method of indicating that a register is occupied is fully disclosed in the present application.

Second, the second AND gate 75 associated with the first one-shot 25 is fed in part by an LSIC signal 101 generated by the input control logic 13 instead of by the one-shot output associated with the preceding register. The LSIC signal 101 indicates by a logical one pulse that a data word has been loaded into the input register and that transfer of that data word to the first register 19 is desired. The logic required to generate a logic one level pulse to indicate a predetermined condition is well-known in the prior art.

Additionally, for proper interfacing with the first register 19, the input register 11 must provide a noninverted and an inverted signal for each bit in the data word to be transferred. If the input register 11 selected for a particular application provides only noninverted bit signals, inverter logic (not shown) may be included to provide the inverted bit signals as is well-known in the art.

Slight logic adaptations are also made near the output register 15 to interface with the output control logic 17. First, the one-shot 39 associated with the output register 15 is driven by a single two-input NAND gate 103 rather than by a NOR gate and two AND gates as is the normal rule. The first input 105 of NAND gate 103 is fed by the output 63 of the preceding one-shot 43. The second input 107 is fed by the $\overline{Q}$ output 79 of the status flip-flop 69 associated with output register 15.

Second, a DC SφC signal 109 is provided to shift data into the output register 15 under the control of the output control logic 17. The DC SφC signal 109 and output signal 63 of the one-shot 39 both drive the NOR gate 110, and the NOR gate 110 drives the inverting buffer 111. The NOR 110 and the buffer 111 together provide the OR function of DC SφC and one-shot 39 output. The DC SφC signal 109 is normally at a logical zero level and pulses to a logical one level when data is to be transferred into the output register 15. If the output register 15 is of the parallel output type, the DC SφC pulse occurs after a data word has been read out therefrom. If the output register 15 is of the serial output type, the DC SφC pulse occurs after the last bit of a data word has been read out therefrom. The DC SφC signal 109 is used to reset the status flip-flop 69 associated with the output register 15 indicating thereby that the output register 15 is ready to receive a new data word. The DC SφC signal 109 is also fed back to the first AND gate 73 driving the one-shot 43 associated with the register 41 immediately preceding the output register 15 to initiate the shifting of a data word to the output register 15.

The output 63 of the one-shot 39 is fed to the output control logic 17 to indicate when a data word has been transferred to the output register 15. Likewise, the Q output 77 of the status flip-flop 69 associated with the output register 15 is provided to indicate the occupancy of the output register 15. Also, the status flip-flop clear line 83 is fed to the output control logic 17 to indicate when all of the status flip-flops 69 have initially and simultaneously been cleared.

It will be appreciated that while only specific embodiments of the present invention and methods of practicing the same have been described and illustrated, changes and modifications therein will be apparent to one skilled in the art, which changes and modifications will nevertheless be within the spirit and scope of the invention as claimed.

What is claimed is:

1. A FIFO register memory for temporarily storing data words comprising:
   input means including a multi-bit input register for reading data words into the memory;
   output means including a multi-bit output register for reading data words out of the memory;
   a plurality of multi-bit registers interposing said input register and said output register;
   gating means interconnecting said plurality of registers for permitting the transfer of a data word in parallel register-by-register from said input register through said plurality of registers to said output register; and
   control means including a plurality of one-shot devices cooperating with said gating means for automatically and asynchronously controlling the transfer of a data word from said input register to said output register.

2. The FIFO register memory according to claim 1 wherein said plurality of one-shot devices includes:
   an individual one-shot device associated with each individual register in said plurality of registers, each said individual one-shot device cooperating with said gating means to control the transfer of data words into the individual register associated therewith.

3. The FIFO register memory according to claim 1 wherein said control means includes:
   an individual status flip-flop associated with each individual register in said plurality of registers, each said individual status flip-flop indicating the data word occupancy of the individual register associated therewith; and
   transfer means responsive to each said individual status flip-flop for inhibiting the transfer of data words into occupied registers in said plurality of registers and for transferring data words into unoccupied registers in said plurality of registers.

4. The FIFO register memory according to claim 3 wherein said gating means includes:
   an individual set of logic gates interposing said input register and said plurality of registers;
   an individual set of logic gates interposing every two registers in said plurality of registers; and
   an individual set of logic gates interposing said plurality of registers and said output register.

5. The FIFO register memory according to claim 4 wherein said transfer means includes:

an individual one-shot device associated with each register in said plurality of registers, each said individual one-shot device cooperating with said gating means to control the transfer of data words into the individual register associated therewith.

6. The FIFO register memory according to claim 5 wherein said transfer means further includes:
  means for initiating an output signal from the individual one-shot device associated with an individual register following a data word transfer from the associated register to the immediately succeeding register in said plurality of registers if and only if a data word is occupying the register immediately preceding the associated register; and
  means for initiating an output signal from the individual one-shot device associated with an individual register following a data word transfer to the register immediately preceding the associated register in said plurality of registers if and only if the associated register is not occupied by a data word.

7. An automatic and asynchronous data word transfer system for use in a FIFO register memory having a multi-bit input register and a multi-bit output register comprising:
  a plurality of multi-bit registers interposing the input register and the output register;
  gating means interconnecting said plurality of registers for permitting the transfer of a data word in parallel register-by-register from the input register through said plurality of registers to the output register; and
  control means including a plurality of one-shot devices and a plurality of status flip-flops cooperating with said gating means for automatically and asynchronously controlling the transfer of a data word from the input register to the output register.

8. The automatic and asynchronous data word transfer system according to claim 7 wherein
  said plurality of one-shot devices includes a one-shot device individually associated with each individual register in said plurality of registers; and
  said plurality of status flip-flops includes a status flip-flop individually associated with each individual register in said plurality of registers, each said individually associated status flip-flop indicating the data word occupancy of the individual register associated therewith.

9. The automatic and asynchronous data word transfer system according to claim 8 wherein said control means further includes:
  logic means responsive to each said individually associated one-shot device and to each said individually associated status flip-flop for inhibiting the transfer of a data word into occupied registers in said plurality of registers and for transferring data words into unoccupied registers in said plurality of registers.

10. The data word transfer system according to claim 9 wherein said logic means includes:
  means for transferring a data word into a particular register from the immediately preceding register in said plurality of registers following the transfer of a data from the particular register to the immediately succeeding register in said plurality of registers; and
  means for transferring a data word into a particular unoccupied register from the immediately preceding register following the transfer of a data word into the same immediately preceding register in said plurality of registers.

11. The data word transfer system according to claim 10 wherein said gating means includes:
  an individual set of logic gates interposing every two registers in said plurality of registers.

12. The data word transfer system according to claim 11 wherein said logic means further includes:
  means for electrically and functionally coupling the one-shot device individually associated with a particular register with the individual set of logic gates interposing the particular register and the immediately preceding register in said plurality of registers.

13. The data word transfer system according to claim 12 wherein said logic means further includes:
  a NOR gate individually driving each said individually associated one-shot device, one said NOR gate for each said individually associated one-shot device;
  a first AND gate individually feeding each said NOR gate, one said first AND gate for each said NOR gate; and
  a second AND gate individually feeding each said NOR gate, one said second AND gate for each said NOR gate.

* * * * *